(12) United States Patent
Ivanov et al.

(10) Patent No.: US 12,343,865 B1
(45) Date of Patent: Jul. 1, 2025

(54) ACTIVE COOLING SYSTEM AND METHOD FOR ROBOT MANIPULATORS

(71) Applicant: Amazon Technologies, Inc., Seattle, WA (US)

(72) Inventors: Yuri Anatoly Ivanov, Arlington, MA (US); Xinyi Cai, Stoneham, MA (US)

(73) Assignee: Amazon Technologies, Inc., Seattle, WA (US)

( * ) Notice: Subject to any disclaimer, the term of this patent is extended or adjusted under 35 U.S.C. 154(b) by 499 days.

(21) Appl. No.: 17/890,541

(22) Filed: Aug. 18, 2022

(51) Int. Cl.
*H05K 7/20* (2006.01)
*B25J 19/00* (2006.01)

(52) U.S. Cl.
CPC ...... *B25J 19/0054* (2013.01); *H05K 7/20209* (2013.01)

(58) Field of Classification Search
CPC .................. B25J 19/0054; H05K 7/20209
See application file for complete search history.

(56) References Cited

U.S. PATENT DOCUMENTS

| | | | | |
|---|---|---|---|---|
| 5,080,000 | A * | 1/1992 | Bubic | B25J 18/06 92/92 |
| 6,499,777 | B1 * | 12/2002 | Wang | G03F 7/70741 414/940 |
| 2014/0276944 | A1 * | 9/2014 | Farritor | A61B 34/30 606/130 |
| 2022/0105587 | A1 * | 4/2022 | Kida | B23K 11/315 |
| 2024/0222185 | A1 * | 7/2024 | Okamura | H01L 21/67109 |

\* cited by examiner

*Primary Examiner* — Gary Collins
(74) *Attorney, Agent, or Firm* — Kilpatrick Townsend & Stockton LLP

(57) ABSTRACT

A robotic system, a manipulator, and a method for cooling actuators are defined. The robotic system can include an actuator of a manipulator, an end effector (e.g., a suction end effector) operably coupled to the actuator, a supply line configured to supply air to the end effector, and a cooling sleeve coupled to the actuator. The end effector can be actuated by the air. The cooling sleeve can include (i) a heat exchange surface (e.g., made of copper) in contact with the actuator, (ii) an inlet, and (iii) an outlet. The cooling sleeve can be configured to receive the air from the supply line via the inlet, to pass the air over the heat exchange surface, and direct the air out of the cooling sleeve via the outlet.

20 Claims, 13 Drawing Sheets

ACTIVE COOLING SYSTEM AND METHOD FOR ROBOT MANIPULATORS

BACKGROUND

Many modern day industries are relying more and more on robotic manipulators. Such robotic manipulators may function to increase repeatability of tasks, increase efficiency of production lines, and bring other benefits to their operators. An example manipulator may include one or more actuators that are frequently actuated for rotating, translating, and otherwise moving an end effector of the manipulator. However, such frequent operation of the actuators may cause heating of the actuators, which can reduce efficiency of the manipulators.

BRIEF DESCRIPTION OF THE DRAWINGS

Various embodiments in accordance with the present disclosure will be described with reference to the drawings, in which.

DETAILED DESCRIPTION

Figure 1:
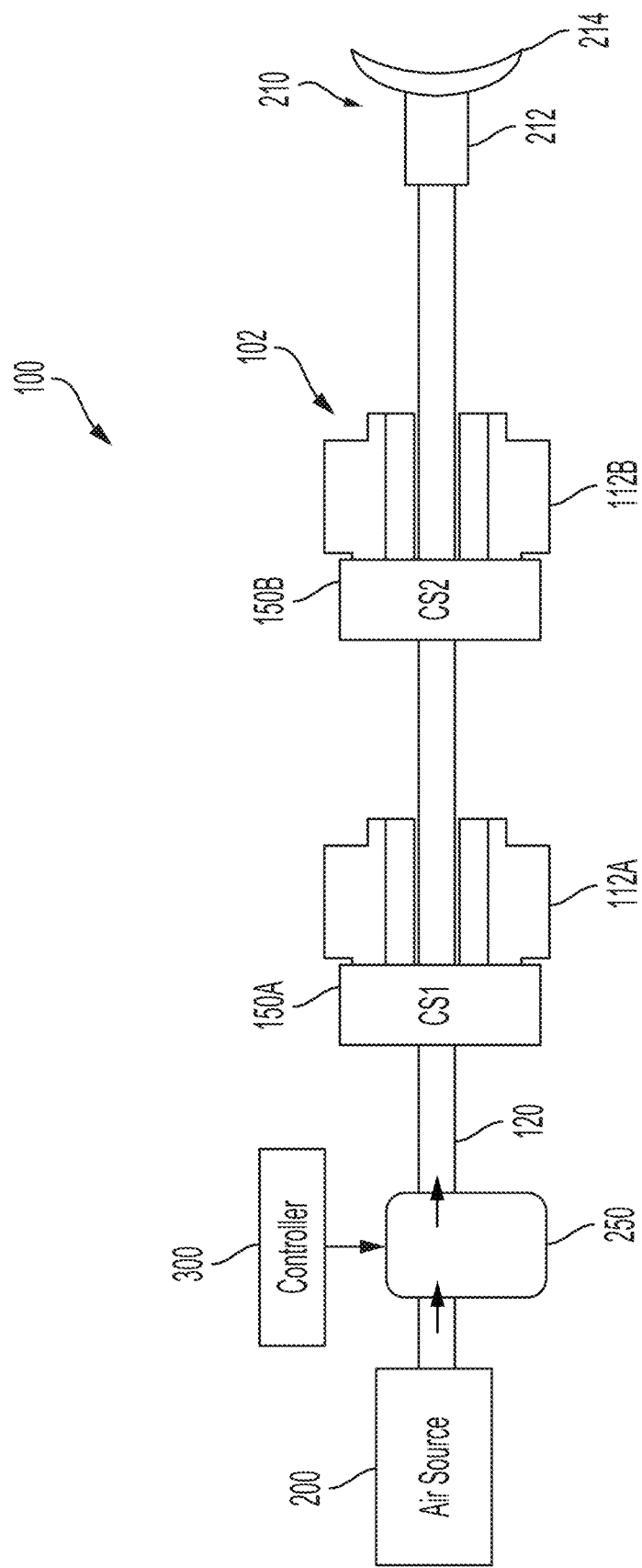
FIG. 1 is a schematic diagram of a cooling system, according to at least one example.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments herein are directed to robotic manipulator system and techniques for cooling the robotic manipulator. The robotic manipulator includes several components including a housing, actuators, and linkages that are so connected that the actuators can be controlled to orient the manipulator, e.g., an end effector coupled to the manipulator, in a desired position to handle items. The actuators may include electric motors that, during operation generate heat. Such heat may negatively affect a life of the actuators and also reduce operational efficiency of the manipulator. An example manipulator described herein is integrated with a cooling system to remove heat from the actuators that make up the manipulator to improve actuator efficiency and longevity. As an example, the cooling system may include a cooling sleeve that surrounds a housing of an actuator and is configured to use an available air supply (e.g., normally routed to an end effector of the manipulator) to provide an active cooling add-on to the actuator. The cooling sleeve may include a metal surface in contact with the actuator to extract heat from the actuator. Multiple cooling sleeves can be coupled to multiple actuators in a daisy-chain to provide continuous cooling throughout multiple actuators that make up the manipulator. Airflow through the manipulator and cooling sleeves can be controlled (e.g., via flow control solenoids) to operate the manipulator in cooling mode only (e.g., use the airflow primarily for cooling the actuators) or provide active cooling while handling an item (e.g., use the airflow for cooling the actuators while also controlling the end effector).

As an illustrative example, a robotic manipulator system includes a robotic manipulator, a control system, a cooling system, and a pneumatic system. The robotic manipulator may include an actuator coupled to an end effector via a linkage. The control system may include a computer or other electronic system for generating signals for controlling other systems and the robotic manipulator. Elements of the cooling system and the pneumatic system may be shared between the two systems. For example, the pneumatic system may include an air source and an air supply line for suppling airflow to the end effector. The cooling system may include a cooling sleeve in contact with each actuator, which may be installed to receive airflow via the air supply line (e.g., as the air flows from the air source to the actuator). In operation, the end effector can be operably coupled (e.g., via linkages, housings, other actuators, or other modular components.) to the actuator. The air supply line can supply air to the end effector (e.g., including a suction cup). For example, the air can be pressurized air pumped from/flowing from the air source to the actuator, or the air can be vacuum air flowing from the end effector to the air source. The cooling sleeve can be coupled to the actuator and configured to receive the air before being directed to the end effector. Upon passing the air through the cooling sleeve, heat is extracted from the actuator causing cooling of the actuator. Thus, the cooling sleeve can advantageously cool the actuator using an existing air supply thereby improving actuator efficiency and longevity without significant number of additional components. Use of the cooling sleeves may also significantly reduce maintenance costs of the manipulator over a period of time. Use of the cooling sleeves may also advantageously facilitate improvements in legacy system without costly modifications to several components.

In a particular example, the cooling sleeve may be coupled to an external housing of the actuator. The cooling sleeve may include an inlet, an outlet, and a heat exchange surface in contact with the external housing of the actuator. The cooling sleeve may be configured to receive air from a supply line via the inlet, pass the air over the heat exchange surface, and direct the air out of the cooling sleeve via the outlet. Similarly, other actuators of the manipulator can be coupled with cooling sleeves to effectuate cooling of the other actuators.

In a first example, the cooling sleeve may include a pipe extending between an inlet and an outlet, and that is configured to convey the air from the inlet to the outlet. The pipe can include a plurality of sections wound in a circular shape such that an inner diameter of the circular shape contacts a surface (e.g., an external surface) of the actuator. In a second example, the cooling sleeve can include a tube that defines an interior volume extending between the inlet and the outlet and a heat exchange surface coupled to the tube. Within the interior volume may be disposed a corrugated strip of material. The corrugated strip can include channels to convey the air from the inlet to the outlet. The corrugated strip can be wound in a circular shape with channels transversely extending over the heat exchange surface such that the channels allow the air to pass over the heat exchange surface to extract heat from the actuator. As an example, the heat exchange surface is made of a heat conductive material such as copper. Additionally or alternatively, a heat transfer pad or thermal pad may be disposed between the cooling sleeve and the external surface of the actuator to enhance (e.g., maximize) heat transfer between the actuator and the cooling sleeve.

Cooling sleeves of multiple actuators that make up a robotic manipulator may be coupled together in a single chain. For example, a first flexible tube may be used to connect the supply line to an inlet of a first cooling sleeve coupled to a first actuator, and a second flexible tube may be used to connect an outlet of the first cooling sleeve to an end effector or to another inlet of a second cooling sleeve coupled to a second actuator. The first flexible tube can pass through the actuator. Similarly, the second flexible tube can pass through another actuator. For example, each actuator may include an internal passage through which the flexible tube can be passed and further connected to another cooling sleeve coupled to the other actuator.

The manipulator of the robotic system can further include flow control solenoids coupled to the supply line to open or close supply of the air to the cooling sleeve and/or the end effector. These flow control solenoids can be controlled individually by a controller. For example, a first flow control solenoid can be coupled to the supply line before the inlet of the cooling sleeve. The first flow control solenoid can be opened or closed by a controller flow of the air from the supply line to the first inlet. Similarly, a second flow control solenoid can be coupled to the second flexible tube between the outlet of the other actuator and the end effector, and can be opened or closed to flow of the air from the other outlet to the end effector.

Referring now to the figures in which like-referenced numerals and/or names may refer to like elements, FIG. 1 is a schematic diagram of an example cooling system 100, according to at least one example. The cooling system can include cooling sleeves 150 (e.g., individually referred as a first cooling sleeve 150A and a second cooling sleeve 150B) configured to cool one or more components of a manipulator 102. For example, the cooling sleeves 150 can use same air source 200 used for actuating an effector coupled to the manipulator 102. In some examples, the cooling sleeves 150 may receive other cooling fluids from a separate line other than the air supply to further enhance cooling efficiency. These other cooling fluids may be in addition to or in place of the air source 200. It can be understood that other variations in cooling fluid or air supply to the cooling sleeves 150 are possible. The cooling fluids or air can be at a temperature lower than a working temperature of the actuator 112. The working temperature may vary depending on the location, number of times the actuator 112 is actuated or other factors.

The manipulator 102 can include actuators 112 (individually referred as a first actuator 112A and a second actuator 112B), and an end effector 210. The air source 200 can be coupled to the end effector 210 via a supply line 120. In some examples, the actuators 112 include an internal channel through which the supply line 120 can pass and coupled to the end effector 210. These actuators 112 advantageously conceal the supply line 120 within the manipulator 102 without exposing the supply line 120 to an outside environment thus providing a compact design and protection of supply line 120 from the outside environment. Additionally, as the same air source 200 can be used for cooling the actuators 112 via the cooling sleeves 150, the cooling system 100 provides a more efficient use of existing components of manipulator 102 or a robotic system in which the manipulator 102 is deployed.

The end effector 210 can be operably coupled to the actuators 112. For example, the actuators 112A and 112B can be coupled via linkages, covers, motor, or other components, which are further discussed in detail with respect to FIG. 2 and FIG. 3. The present disclosure is not limited by coupling mechanism used in the manipulator 102. The end effector 210 receives air from the air source 200 via the supply line 120. The air source 200 may be configured to supply pressurized or vacuum air. The end effector 210 can be actuated (e.g., rotated, translated, etc.) by this air (e.g., pressurized air) to handle items e.g., in an inventory system or other material handling systems. In some examples, the end effector 210 can be include a venturi valve 212 and a suction cup 214. The venturi valve 212 can be coupled to the suction cup 214 such that the air from the air source is delivered to the venturi valve 212 to create a suction pressure at the suction cup 214 to pick up an item to be handled.

In some examples, the manipulator 102 can be further coupled with a flow control solenoid 250 controllable by a controller 300 to open or close flow of the air from the air source 200 to the end effector 210. For example, the flow control solenoid 250 may be located at the supply line 120 on an inlet side of a first cooling sleeve 150A to initiate supply of the air from the air source 200 to the first cooling sleeve 150A to cause cooling of the first actuator 112A followed by supplying, via the same supply line 120, the pressure air to the second cooling sleeve 150B to cause cooling of the second actuator 112B.

In the example of FIG. 1 discussed above, two actuators 112 coupled with two cooling sleeves 150 are connected in series. However, the present disclosure is not limited to a number of actuators and corresponding cooling sleeves. It is possible that the manipulator 102 can include one, two, three, or more actuators, each of which may be coupled to a cooling sleeve. In some configurations, alternate actuators may be coupled with a cooling sleeve. Also, the present disclosure is not limited to connecting cooling sleeves in series. In some configurations, parallel or daisy connections between different actuators and cooling sleeves is possible. For example, a daisy connection comprises one cooling sleeve with one or more inputs and multiple outputs coupled to other cooling sleeve inputs. Furthermore, one or more supply lines may be used to supply air or other cooling medium to the cooling sleeves.

Figure 2:
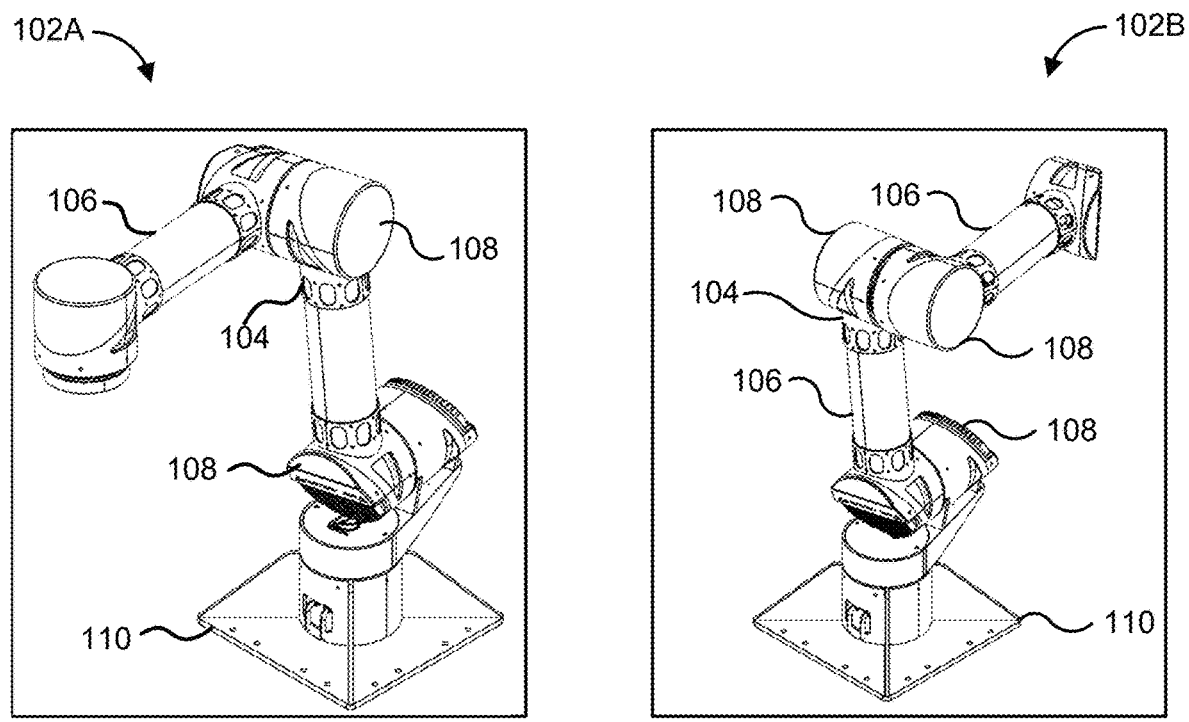
FIG. 2 are example components and example modules of robotic manipulators, according to at least one example.
Figure 3:
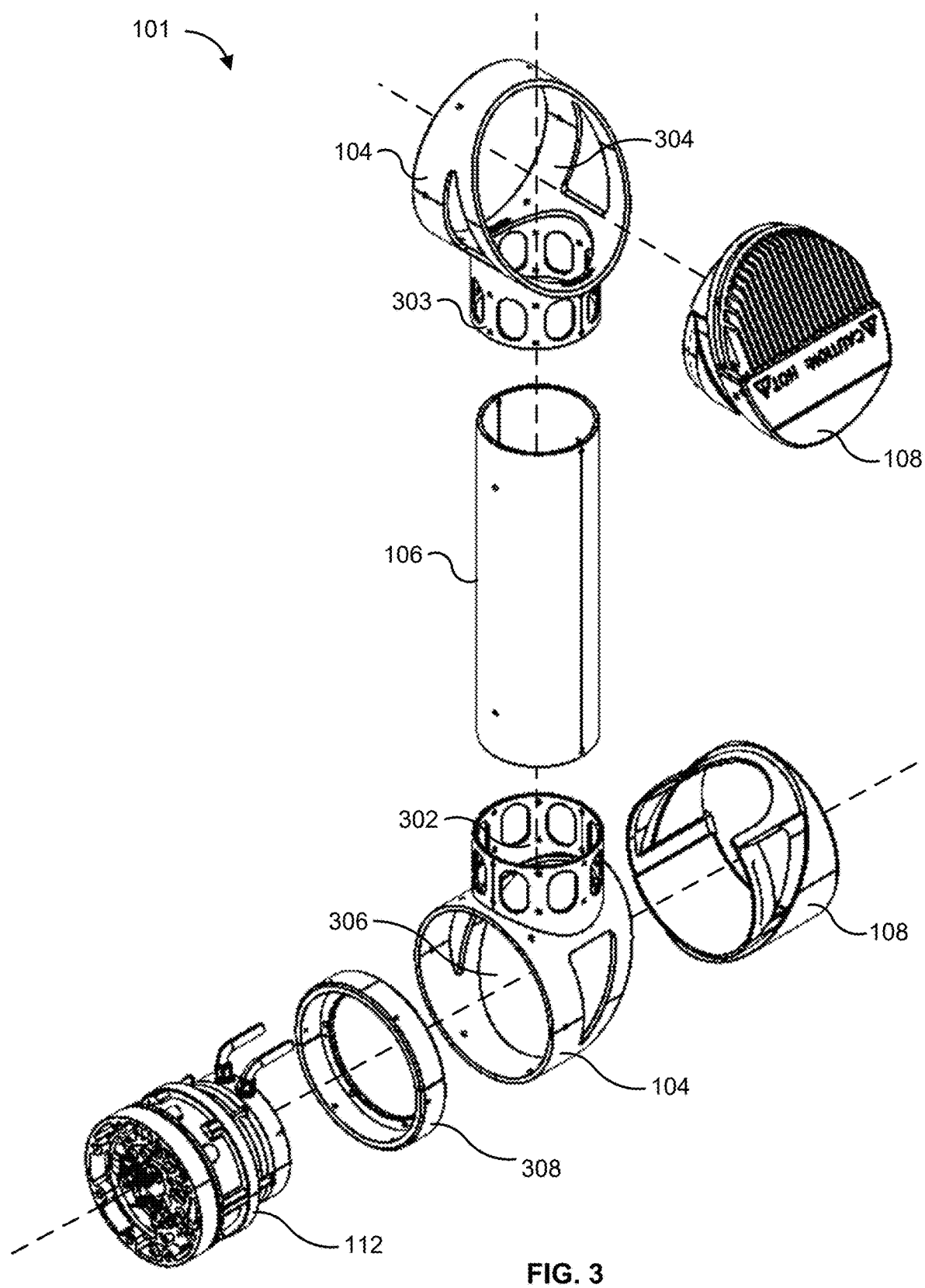
FIG. 3 is an exploded view of an example module including example components of FIG. 2, according to at least one example.

Turning now to FIG. 2 and FIG. 3, these figures illustrate robotic manipulators 102 (e.g., individually identified as robotic manipulators 102A and 102B in FIG. 2). The manipulators 102 can include different types of components. For example, the components can include a housing 104, a linkage 106, a cover 108, a base 110, an actuator 112 (see FIG. 3), or any suitable type of component. Each type of component can have the same or similar pertinent dimensions (e.g., can be modular components) such that one component of a first type can be replaced by another component of the same type without adjusting the other components of the robotic manipulator 102. For example, one housing 104 can be replaced by another housing 104 without needing to use any additional connectors or components. In some examples, the components of the same type can have different non-pertinent dimensions or features. The non-pertinent dimensions can allow some aspects of the robotic manipulator 102 to be changed without needing to completely disassemble or redesign the robotic manipulator 102. For example, a linkage 106 having a first length can be replaced by a linkage 106 having a second different length because the linkages 106 have the same diameter (e.g., have the same pertinent dimension). In some embodiments, the linkage 106 can have different diameters. For example, a first end of the linkage 106 can have a first diameter configured to couple with an opening 303 of the housing 104 and a second end of the linkage 106 can have a second diameter configured to couple with an opening 302 of another housing 104.

As an illustrative example, a housing 104 can have a circular opening with a dimension (e.g., an interfacing dimension) which can receive a cylindrical linkage 106 (e.g., the interior diameter of the circular opening is the same or slightly larger than the exterior diameter of the cylindrical linkage 106.

A module 101 (see FIG. 3) of the manipulator 102 can include one or more components. The module 101 can include components combinable with other modules 101. One or more of the components can be rotated or one or more of the components can be lengthened. For example, the modules 101 and/or the components can be combined in a first way to build a first robotic manipulator 102A and can be combined in a second way to build a second robotic manipulator 102B. The first and second robotic manipulators 102A, 102B can perform the same, similar, or different functions. For example, the first and second robotic manipulators 102A, 102B can perform the same function (e.g., interacting with an item). In some examples, some or all of the modules 101 and/or components of the first robotic manipulator 102A can be removed and used to build the second robotic manipulator 102B. However, the second robotic manipulator 102B can be built using different modules 101 and/or components than those used to build the first robotic manipulator 102A. Additionally or alternatively, one or more of the modules 101 can be modified (e.g., to change how the robotic manipulator 102A moves and/or operates). For example, a cover 108 can be removed from a module 101 that makes up at least a portion of the robotic manipulator 102 and replaced with a different cover 108.

In further examples, one or more of the components and/or modules 101 can include electronics (e.g., a controller). The electronics can include information about the components, the modules 101, and/or the locations of the components and/or the modules 101 (e.g., the location of the components relative to one another). The electronics can communicate with one another (e.g., via a wired or wireless connection) to communicate information about the components and/or to provide electrical power to the components.

The robotic manipulator 102 may be any suitable material handling equipment (e.g., Cartesian robot, cylindrical robot, spherical robot, articulated robot, parallel robot, SCARA robot, anthropomorphic robot, any other suitable robotic manipulator and/or robotic arm, automated guided vehicles including lift capabilities, vertical lift modules, and any other suitable material handling equipment that interacts with or otherwise handles objects).

In some examples, depending on the function of the robotic manipulator 102, the robotic manipulator 102 can include an end effector (e.g., the end effector 210). The end effector can manipulate various items. For example, the end effector can grasp an item and move the item. Example categories of end effectors include: soft robotic end effectors, vacuum end effectors, electro-adhesion end effectors, and mechanical or electromechanical end effectors. Soft robotic end effectors may generally include flexible structures that may be manipulated between various orientations. The structures may include silicon bodies or other flexible material. Manipulation of the flexible material may be achieved through use of flexible actuators such as air muscles (e.g., contractile or extensional devices operated by air movement relative to filling or emptying a pneumatic bladder), electro-active polymers (e.g., polymers which change size or shape when stimulated by an electric field), or Ferrofluids (e.g., fluids having suspended Ferro-magnetic particles capable of altering a size or shape of the fluid volume when subjected to a magnetic field). Vacuum end effectors may grasp objects using suction. Electro-adhesion end effectors can include an array of electrodes arranged along a flexible or rigid substrate capable of applying a charge (akin to static electricity) that can adhere an object to the substrate portions that are in contact with the object. Mechanical or electromechanical end effectors may include pinchers, claws, grippers, or other rigid components that may be actuated relative to one another for grasping an object. Other end effectors may also be utilized to facilitate additional grasping functions.

Turning to FIG. 3, an exploded view of an example module 101 including example components of FIG. 2 is shown, according to at least one example. The module 101 includes housings 104, a linkage 106, a cover 108, and an actuator 112, however, the module 101 can include additional and/or alternative components or may be assembled with the components combined in a different order or with different orientations. In some examples, the module 101 can include a single housing 104 and an actuator 112. The components of the module 101 can be connected (e.g., coupled or combined) together to form the module 101. The components of the module 101 can be connected using fasteners, snap-fit connectors, adhesives, snaps, hook and loop connectors, or any suitable connector or coupling technique.

The housing 104 can be or include a structure with multiple openings for connecting to the other components. A first opening 302 can include a structure (e.g., can be partially or fully surrounded by a structure) which can connect to the linkages 106. For example, the first opening 302 can be or include a collar 303 which can receive a portion of the linkage 106. The first opening 302 can include interfacing dimensions which correspond to the interfacing dimensions of the linkages 106. For example, the opening 302 can be a circular opening with an inner interfacing diameter that corresponds to the outer interfacing diameter of a cylindrical linkage 106.

The collar 303 and the linkage 106 can include openings for fasteners. For example, the openings in the collar and the linkage 106 can be aligned and a fastener can be put through the collar 303 and the linkage 106. The collar and the linkage 106 can include multiple fastener opening that can allow the housing 104 to be moved relative to the linkage 106.

A second opening 304 can be used to connect the housing 104 with the cover 108. The second opening 304 can receive a portion of the cover 108, for example, as part of a snap fit. The second opening 304 can allow the cover 108 to be removed and replaced. For example, the cover 108 can be unsnapped and removed and a second cover 108 can be attached. The interfacing dimensions of the second opening 304 can correspond to the interfacing dimensions of the cover 108, another housing 104, or any interfacing dimensions of any of the other components 100.

A third opening 306 can be used to connect the housing 104 with other components. For example, the third opening 306 can be used to connect the housing 104 with a linkage 106, another housing 104, a cover 108, or an actuator 112. The third opening 306 can include interfacing dimensions which correspond to the interfacing dimensions of the other components 100.

In some examples, the third opening 306 can receive an adapter 308 which can be used to couple the housing 104 with the other components. The adapter 308 can be used to decrease or increase the diameter of the third opening 306 to accommodate components that respectively have a smaller or larger diameter than the third opening 306. For example, the adapter 308 can be used to receive the actuator 112 in the third opening 306. In further examples, the adapter 308 can extend out of the housing 104 (e.g., via the third opening 306). The portion of the adapter 308 that extends out of the housing 104 can be used to connect one housing 104 with another housing 104, for example.

The linkages 106 can be or include a structure which can connect two components together. For example, the linkages 106 can be used to connect two housings 104 together (e.g., one housing connected to each end of the linkage 106). In some examples, the linkages 106 are cylindrical structures, however, the linkages 106 can be any suitable shape.

The covers 108 can be or include structures which cover one or more of the openings 302, 304, 306. As discussed further in reference to FIG. 8 and FIG. 9A, the covers 108 can include openings for connectors and/or features for electronics.

The actuators 112 can move the components. For example, the actuators 112 can be or include a rotational actuator to rotate the components, a linear actuator which can extend in a linear direction, and/or another suitable motor or actuator. In some examples, the actuators 112 can connect to the end effector for movement of the end effector and/or to cause the end effector to move. In some examples, the actuators 112 may include some or all of the structure of the end effector.

In various examples, one or more of the components used to build the robotic manipulator 102 can include channels through which wires or other conduits can be routed. For example, wires can extend through the connected components (e.g., the modules 101) to provide power and/or communicate data between the components and/or the modules 101. As an illustrative example, wires can extend from the actuator 112 into the third opening 306 of the housing 104, out of the first opening 302, and through the linkage 106. In some examples, one or more of the components can include connectors for electrically connecting the components. For example, when the components are assembled into a module 101, the connectors can be connected to provide power and/or transmit data to and/or from the components and/or the module 101. In some examples, components may include suitable conduits and/or connectors for networks relevant to other mediums, such as air or other gases (e.g., for suction, pneumatics, or other purposes), or water or other fluids (e.g., for coolant, hydraulics, or other purposes), or other substances (e.g., such as for printing or other depositing functions, or other purposes).

Figure 4:
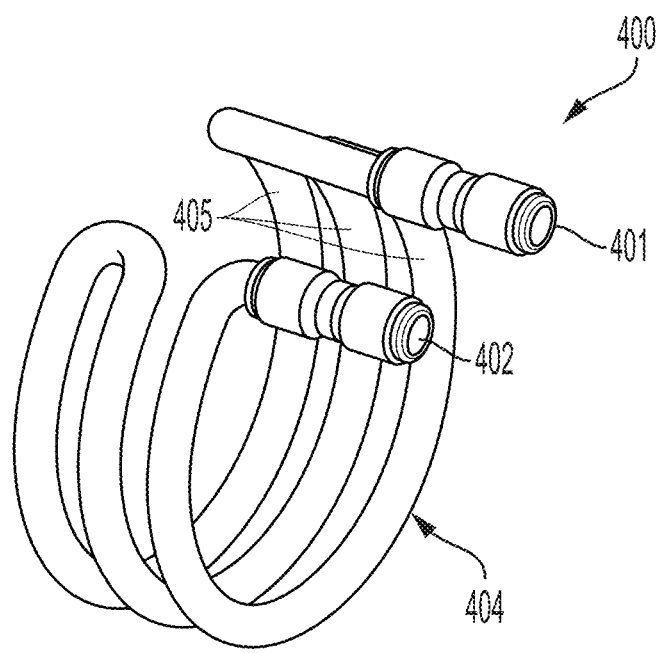
FIG. 4 is an example cooling sleeve, according to at least one example.
Figure 5A:
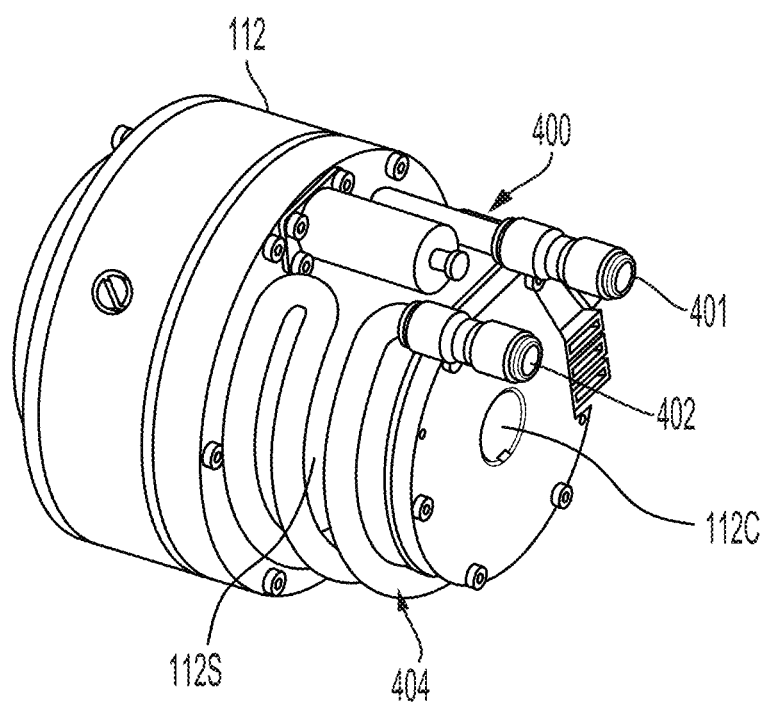
FIG. 5A is the cooling sleeve of FIG. 4 coupled to an actuator, according to at least one example.

FIG. 4 is an example of a cooling sleeve 400, and FIG. 5A is the cooling sleeve 400 coupled to an actuator, according to at least one example. The cooling sleeve 400 can be used as the cooling sleeves 150 (in FIG. 1). The cooling sleeve 400 can include a heat exchange surface 405, an inlet 401, and an outlet 402. In an example, the cooling sleeve 400 can be a tubular pipe 404 configured to be coupled to an actuator by sliding over an external surface 112S of the actuator 112 (see FIG. 5A). Accordingly, the heat exchange surface 405 of the cooling sleeve 400 can be a portion of the tubular pipe 404 that comes in contact with the external surface 112S of the actuator. The pipe 404 can extend between the inlet 401 and the outlet 402 to convey the air from the inlet 401 to the outlet 402. In some examples, the pipe 404 can include one or a plurality of sections wound in a circular shape such that an inner diameter of the circular shape contacts the external surface 112S of the actuator 112. The outlet 402 can be configured to pass through the internal channel 112C of the actuator 112 and contact an external surface of the internal channel 112C to transfer heat internally. For example, the outlet 402 can be coupled to an extended heat conductive pipe and/or thermal pad interfacing between the internal channel 112C and the heat conductive pipe extending from the outlet 402.

In some examples, the actuator 112 can be a stepped cylinder with a stepped portion i.e., the external surface 112S being configured to receive the cooling sleeve 400. The external surface 112S can have a smooth surface and a shoulder so that when the cooling sleeve 400 is slidably coupled it can abut against the shoulder for easy assembly. In some examples, the external surface 112S can include circular depressions (not shown) to receive inner diameter of the pipe segments of the cooling sleeve 400. The circular depressions can increase a contact area of the external surface 112S with the cooling sleeve 400 thereby improving heat exchange efficiency.

The cooling sleeve 400 is configured receive the air (e.g., from the air source 200 or vacuum air from the end effector 210 in FIG. 1) via the inlet 401, circulate the air through the pipe 404, and direct the air out via the outlet 402. In some examples, the actuator 112 includes an internal channel 112C through which a supply line 120 can pass and be further connected to the inlet 401. While the air is being circulated through the pipe 404, the air passes from inside at the heat exchange surface 405 (e.g., inner diameter in contact with the external surface 112S) and extracts any heat from the external surface 112S of the actuator 112 via conduction.

The pipe 404 can be made of heat conductive material such as a metal (e.g., copper). In some examples, only the heat exchange surface 405 that contacts the actuator 112 can be made of the heat conductive material. In the example shown, the heat exchange surface 405 is an inner diameter of the circularly wound pipe 404. However, in some examples, the heat exchange surface may be a separate piece (e.g., a circular copper plate) attached at the inner diameter of the pipe 404. The circular copper plate may provide a larger surface area for heat exchange thus improving heat exchange efficiency. FIG. 4 and FIG. 5A show the cooling sleeve 400 as a separately formed component configured to couple to the external surface 112S of the actuator 112. Alternatively, the cooling sleeve 400 can be integrally formed on the surface (e.g., the external surface 112S or a surface of the internal channel 112C) of the actuator. For example, an external surface 112S of the actuator 112 may be configured to include enclosed channels or grooves similar in shape as the pipe 404. The enclosed channels can receive the air from the air source 200 or other cooling fluid through an inlet (e.g., similar to the inlet 401) to cause cooling of the actuator 112. Additionally or alternatively, a heat transfer pad may be disposed between the cooling sleeve 400 and the external surface 112S of the actuator 112.

Figure 5B:
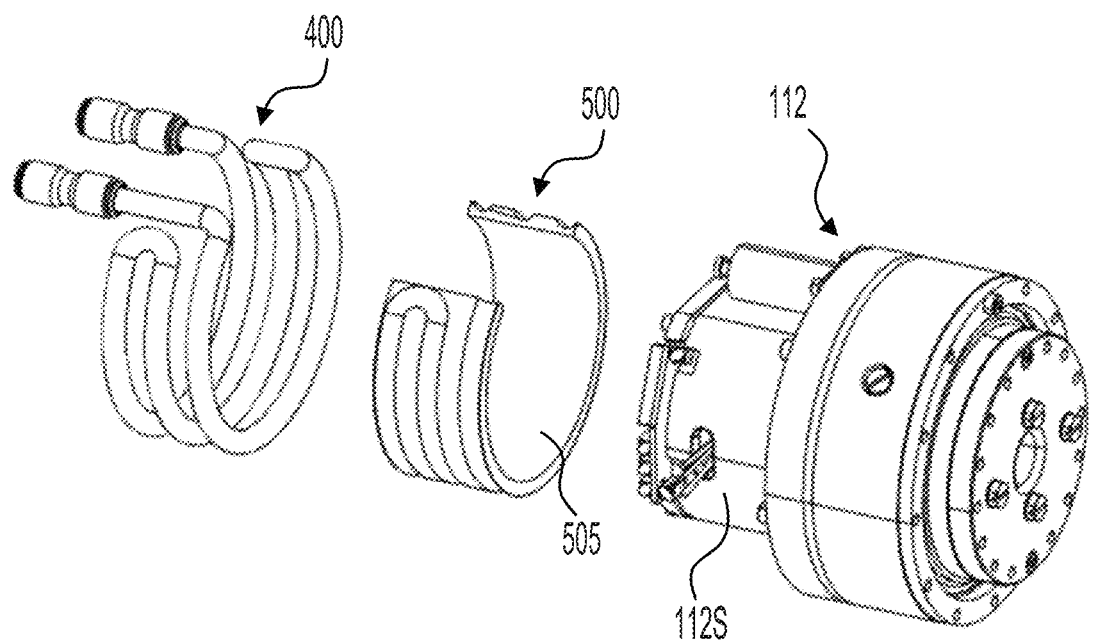
FIG. 5B is an exploded view of showing the cooling sleeve of FIG. 4, a heat transfer pad, and the actuator, according to at least one example.
Figure 5C:
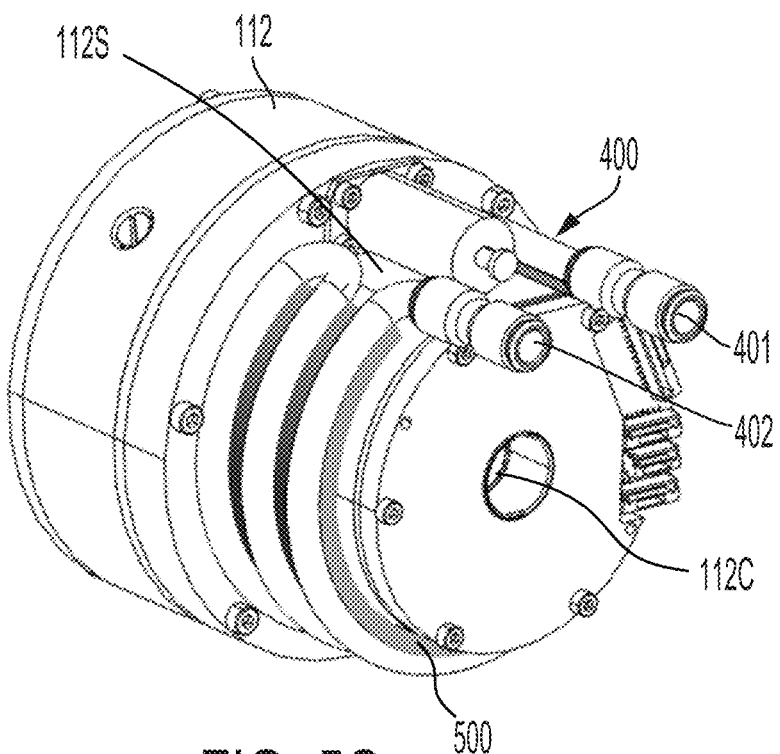
FIG. 5C is an assembled view the cooling sleeve of FIG. 4, the heat transfer pad of FIG. 5B, and the actuator, according to at least one example.

FIG. 5B is an exploded view of the cooling sleeve 400, a heat transfer pad 500, and the actuator 112, and FIG. 5C is an assembled view the cooling sleeve 400, the heat transfer pad 500, and the actuator, according to at least one example. The heat transfer pad 500 can be made of flexible heat conductive material to serve as thermal interface material between two components and transfer heat from one to the other. As shown in FIG. 5C, the heat transfer pad 500 is disposed between the heat exchange surface 405 of the cooling sleeve 400 and the external surface 112S of the actuator 112. The heat transfer pad 500 has a sheet like shape that increases the surface area for heat transfer. For example, when the heat transfer pad 500 is coupled to the heat exchange surface 405 of the cooling sleeve 400, heat transfer between the cooling sleeve 400 and the actuator can be increased to provide enhanced cooling of the actuator 112. The heat transfer pad 500 can include slots conforming to the shape of the heat exchange surface 405 to provide improved surface contact at interface between components.

Figure 6:
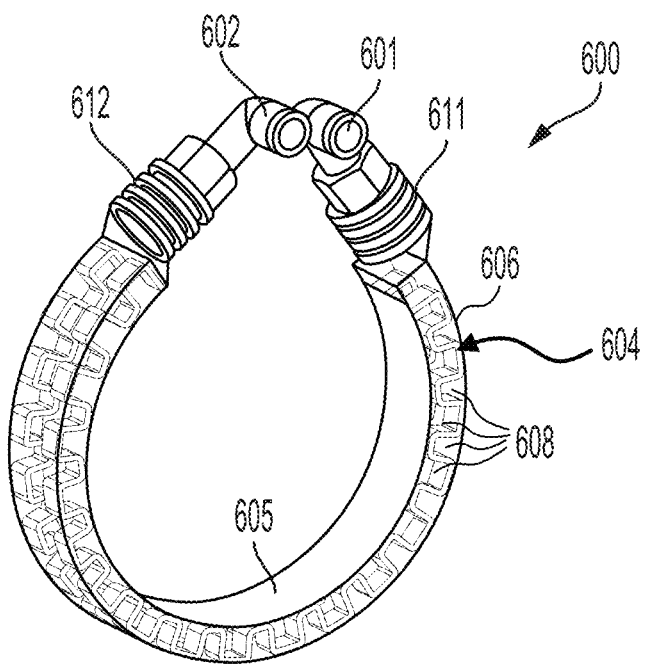
FIG. 6 is another example cooling sleeve, according to at least one example.
Figure 7:
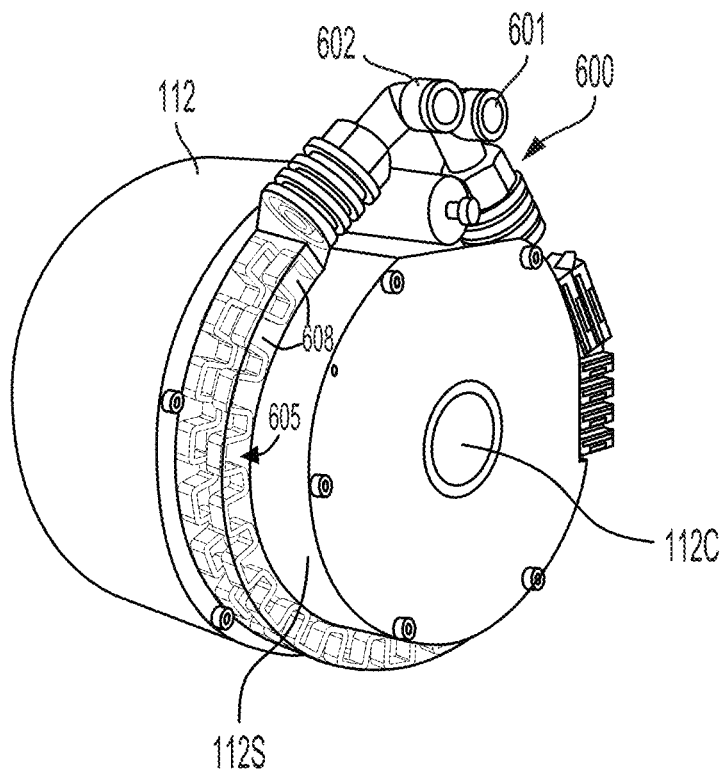
FIG. 7 is the cooling sleeve of FIG. 6 coupled to an actuator, according to at least one example.

FIG. 6 is another example of a cooling sleeve 600, and FIG. 7 is the cooling sleeve 600 coupled to an actuator, according to at least one example. The cooling sleeve 600 can be used as the cooing sleeves 150 (in FIG. 1). The cooling sleeve 600 can include an inlet 601, an outlet 602, a heat exchange surface 605, and a tube 606 that defines an interior volume extending between the inlet 601 and the outlet 602. In some examples, the heat exchange surface 605 can be a plate made of heat conductive metal (e.g., copper) and coupled to the tube 606. The heat exchange surface 605 may be integrally formed with the tube 606. For example, the heat exchange surface 605 can be coupled to a portion configured to couple with the actuator 112. In some examples, the tube 606 can be a hollow tube having an internal volume and bent in a circular shape to couple with the actuator 112 (see FIG. 7). The tube 606 may have a circular, rectangular or other cross-section. In some examples, the rectangular cross-section of the tube 606 may provide an increased surface area (e.g., an inner diameter) to contact with the actuator 112. In some examples, the tube 606 may include an inlet connector 611 and an outlet connector 612 coupled to the inlet 601 and the outlet 602, respectively. The inlet connector 611 and the outlet connector 612 can be rubber bellows or formed from any other suitable flexible material to allow minor adjustments of cooling sleeve 600 during installation over the actuator 112 or when coupling supply lines. The cooling sleeve 600 can further include a corrugated strip 604 disposed within the interior volume. The corrugated strip 604 can be made of a heat conductive material (e.g., copper, or aluminum). The corrugated strip 604 can include channels 608 to convey the air from the inlet 601 to the outlet 602. The corrugated strip 604 can be wound in a circular shape with the channels 608 transversely extending over the heat exchange surface 605 such that the channels 608 allow the air to pass over the heat exchange surface 605 to extract heat from the actuator 112.

Similar to the cooling sleeve 400, the cooling sleeve 600 can be coupled to the external surface 112S and the air supply 200 to circulate the air through the tube 606 to extract heat from the external surface 112S via the heat exchange surface 605 by convection. In some examples, the actuator 112 includes an internal channel 112C through which a supply line 120 can pass and be further connected to the inlet 601 of the cooling sleeve 600, as shown in FIG. 7. In some examples, the cooling sleeve 600 can be integrally formed on the external surface 112S of the actuator 112.

Figure 8:
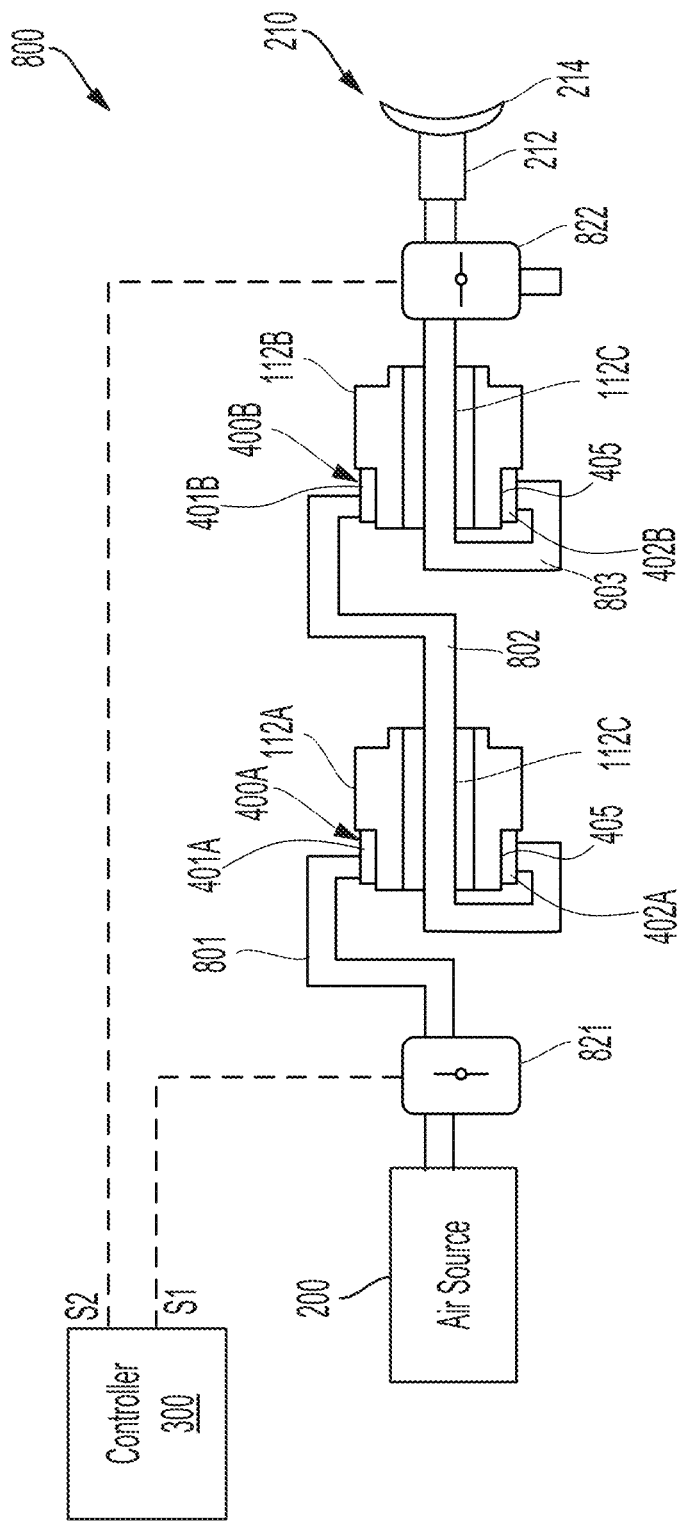
FIG. 8 is a schematic diagram of a cooling system including solenoid control valves, according to at least one example.

FIG. 8 is a schematic diagram a cooling system including solenoid control valves, according to at least one example. For example, a robotic system 800 implements a cooling system 100 similar to FIG. 1 with the cooling sleeves 400A and 400B, according to at least one example. Alternatively or in additional another type of cooling sleeves 600A and 600B may be integrated with the cooling system 100. The type of cooling sleeve does not limit the scope of the present disclosure, and other variations in or combinations of the cooling sleeves are possible.

Figure 9A:
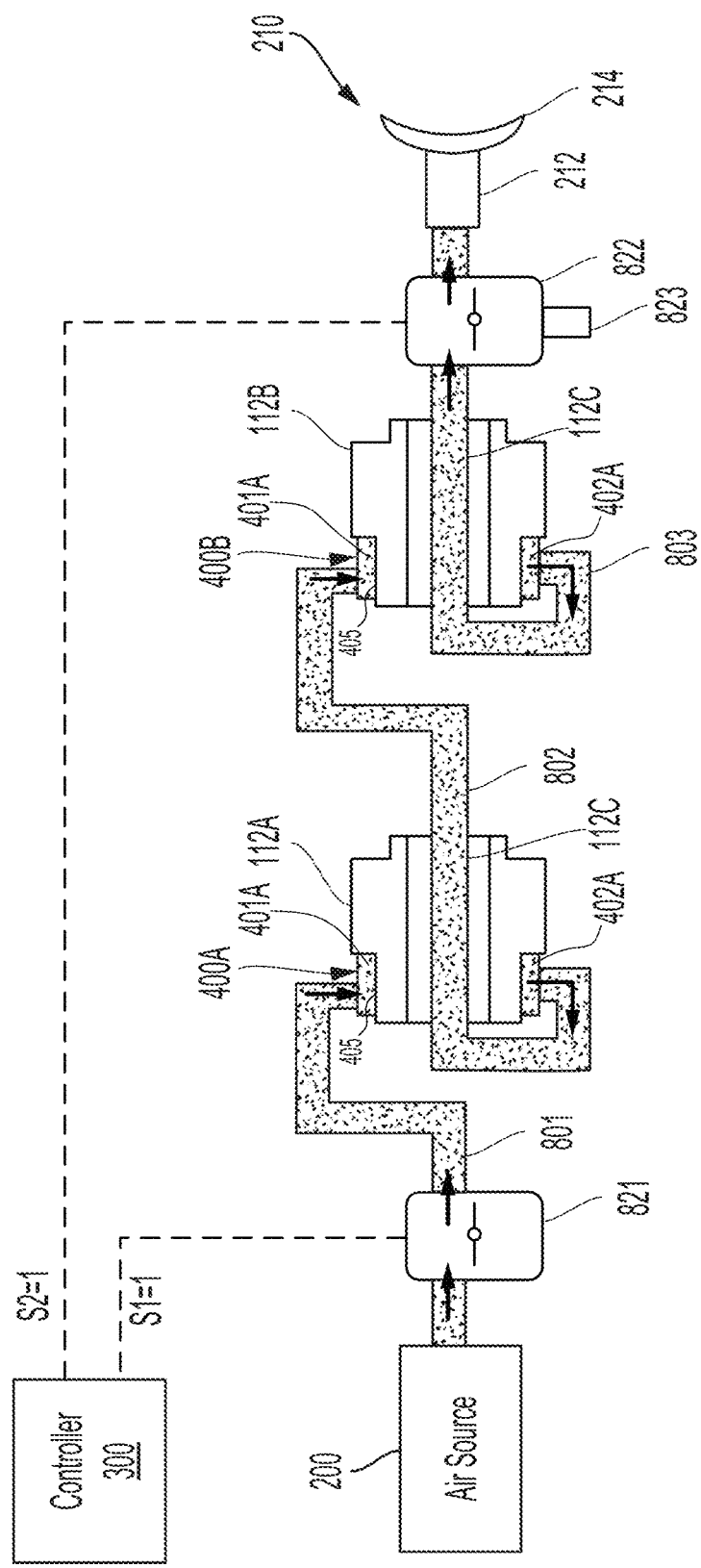
FIG. 9A is a schematic diagram of the cooling system of FIG. 8 with solenoid control valves each in an open state, according to at least one example.
Figure 9B:
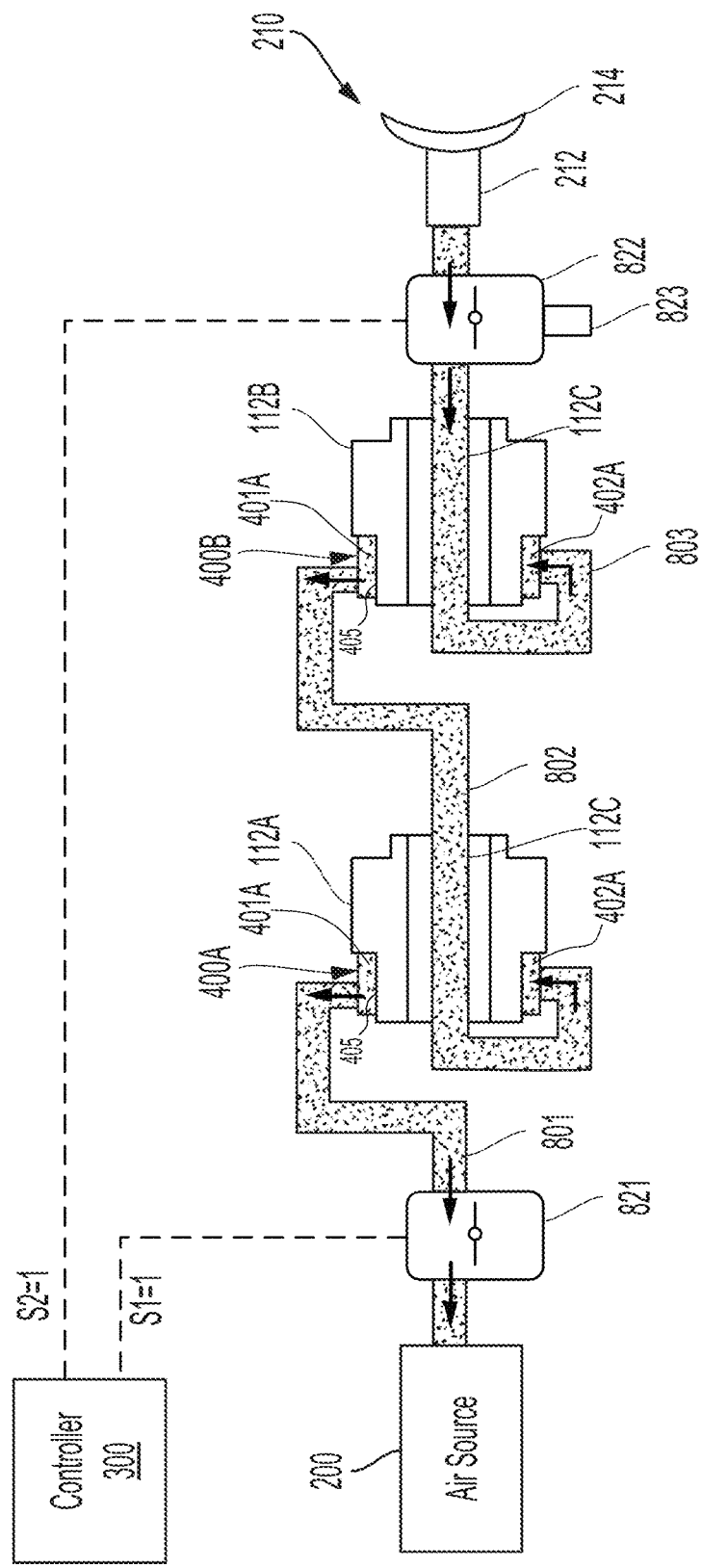
FIG. 9B is a schematic diagram of the cooling system of FIG. 8 with solenoid control valves each in an open state, according to at least one example.
Figure 10:
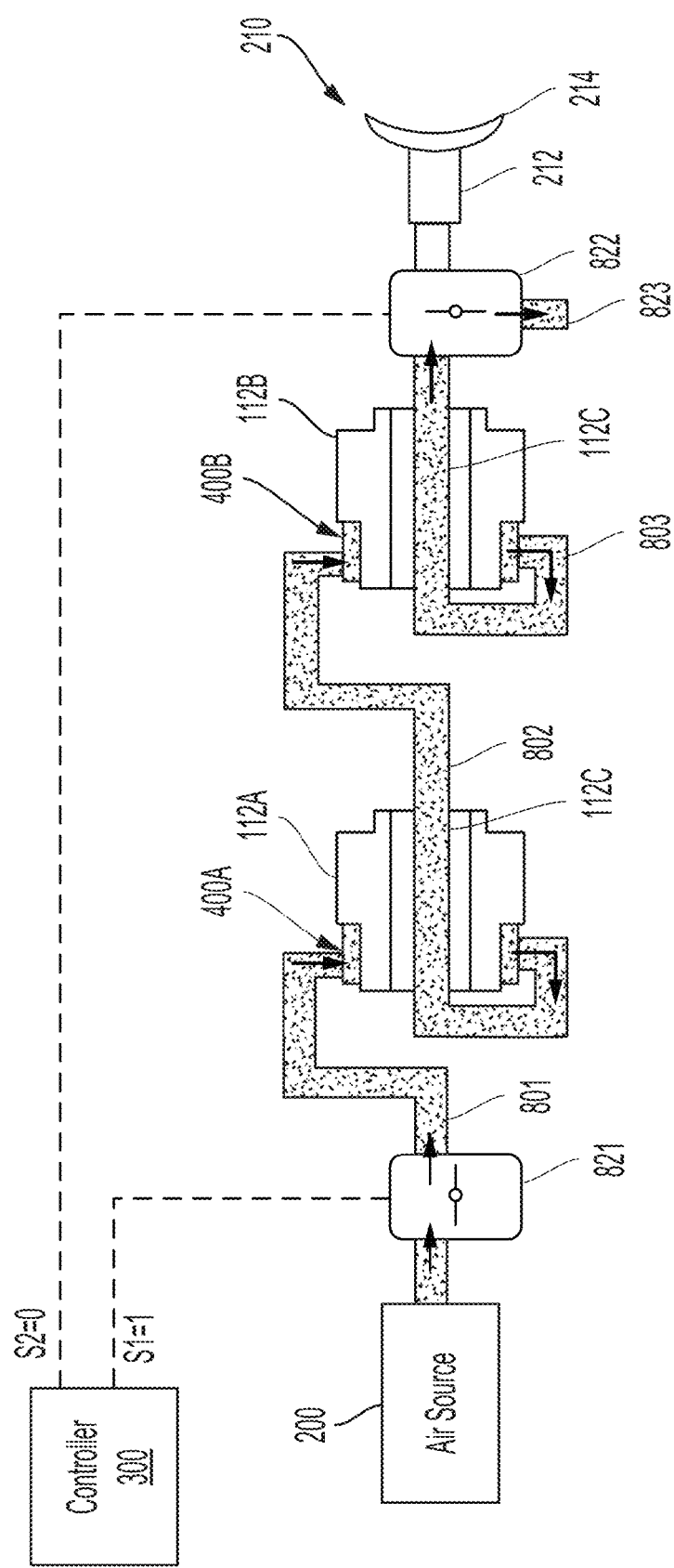
FIG. 10 is a schematic diagram of the cooling system of FIG. 8 with one solenoid control valve in an open state and another solenoid valve in a closed state, according to at least one example.

The system 800 can include the air source 200, actuators 112 (individually referred as the first actuator 112A and the second actuator 112B), the cooling sleeves 400 (individually referred as a first cooling sleeve 400A and a second cooling sleeve 400B), flexible tubes 801, 802, and 803, and the end effector 210, and flow control solenoids 821 and 822. As shown, the first actuator 112A is coupled in series with the second actuator 112B to cause actuation of the manipulator to orient the end effector 210 in a desired orientation. In some examples, an exit port 823 can be provided or coupled at the second flow control solenoid 822 to direct the air to atmosphere instead of to the end effector 210. In some examples, the robotic system 800 can be controlled by controlling the flow control solenoids 821 and 822. The robotic system 800 can be configured to provide bi-directional cooling by controlling direction the air flow between the air source 200 and the end effector 210. For example, cooling and actuation of the end effector 210 can be achieved as shown in FIG. 9A by controlling the air flow (bold arrows) from the air source 200 to the end effector 210. In another example, cooling can be achieved as shown in FIG. 9B by passing air from the end effector 210 toward the air source 200. For example, as shown in FIG. 9B, the air source 200 can create a vacuum by suck air from the end effector 210 or the exit port 823. It can be seen that the air flow (bold arrows) in FIG. 9A is opposite of the air flow (bold arrows) in FIG. 9B. In another example, cooling can be activated without actuating the end effector 210, as shown in FIG. 10.

As shown, the first cooling sleeve 400A can coupled external to the first actuator 112A. The first heat exchange surface 405 can be in contact with the first actuator 112A. A first flexible tube 801 can be coupled to the first inlet 401A of the first cooling sleeve 400A. The first outlet 402A of the first cooling sleeve 400A can be coupled to a second inlet 401A of the second sleeve 400B via a second flexible tube 802. The second flexible tube 802 can be passed through an internal channel 112C of the first actuator 112A leading to the second inlet 401A of the second cooling sleeve 400B. The second cooling sleeve 400B can coupled external to the second actuator 112B. The second heat exchange surface 405 of the second cooling sleeve 400B can be in contact with the second actuator 112B. A third flexible tube 803 can be coupled to the second outlet 402B of the second cooling sleeve 400B and passed through an internal channel 112C of the second actuator 112B to the end effector 210. In some embodiments, portions of the tubes 802, and 803 passing through the internal channels 112C of the actuators 112A and 112B, respectively, can be made of heat conductive material to further extract heat internally from the respective actuators.

The first cooling sleeve 400A can receive the air from the air supply (e.g., 200 in FIG. 1) via the first flexible tube 801 and the first inlet 401A. The air is circulated through the first cooling sleeve 400A including the first heat exchange surface 405, and direct the air out via the first outlet 402A. Further, the second flexible tube 802 can convey the air to the second cooling sleeve 400B via the second inlet 401B. The air is circulated through the second cooling sleeve 400B over the second heat exchange surface 405, and direct the air out via the second outlet 402B.

In some examples, the air supply can be controlled by the first flow control solenoid 821 and the second flow control solenoid 822. The first flow control solenoid 821 can be coupled to the supply line before the first inlet 401A of the first cooling sleeve 400A. The first flow control solenoid 821 can be opened or closed via the controller (e.g., 300 in FIG. 1) so that the air from the supply line can be conveyed to the first inlet 401A. The second flow control solenoid 822 can be coupled to the third flexible tube 803 between the second outlet 402B of the second cooling sleeve 400B and the end effector 210. The second flow control solenoid 822 can be opened or closed to control flow of the air from the second outlet 400B to the end effector 210. Each of the first flow control solenoid 821 and the second flow control solenoid 822 can be independently operable between an open state and a closed state.

As an example, referring to FIG. 9A, both the first flow control solenoid 821 and the second flow control solenoid 822 can be in the open state causing the air to flow through the cooling sleeves 400A and 400B cooling the actuators 112 (individually referred as 112A and 112B). The flow path is indicated by arrows in bold. Further, the air exits from the flexible tube 803 to actuate the end effector 210. For example, the air passes through the venturi valve 212 to create suction at the suction cup 214 to pick up an item.

As an example, referring to FIG. 10, when the first flow control solenoid 821 is in the open state and the second flow control solenoid 822 is in the closed state causing the air to flow to the first cooling sleeve 400A and the second cooling sleeve 400B to cool the actuators 112 (individually referred as 112A and 112B). The flow path is indicated by arrows in bold. As the second solenoid 822 is closed, the air exits to the atmosphere through the exit port 823 without actuating the end effector 210.

Referring to FIG. 9A and FIG. 10, a method to selectively open and close the solenoids 821, 822 may be implemented on the controller 300 to cycle between cooling of the actuators 112A, 112B and actuating the end effector 210. For example, the selectively opening and closing the solenoids 821, 822 can be based on inputs from sensors, a predetermined time table, or user inputs. For example, a temperature sensor may be coupled to the actuators 112A and 112B for sensing temperature of the actuators. The temperature sensor can send temperature information to the controller 300.

Based on the temperature information, the controller 300 can make a determination of when to enable cooling only and when to enable simultaneously cooling and actuating of the end effector. For example, a first condition may be whether the temperature of the actuators 112A, 112B are within a desired range. If the first condition is satisfied, the controller can send control signals S1=1 and S2=1, as shown in FIG. 9A. A second condition may be whether a temperature exceeds a temperature threshold indicative of damaging one or more components e.g., motor of the actuator. Accordingly, the controller can send a signal S1=1 and S2=0 to the solenoids 821 and 822, respectively, as shown in FIG. 10.

It can be understood that controlling by the controller 300 is not limited to temperature based conditions. In some examples, the controller 300 may enable cooling only based on predetermined time intervals or after a threshold number of items are picked up or dropped off by the end effector 210. In some examples, the controller 300 may receive an orientation signal from the end effector 210. Based on the orientation signal, the controller 300 may determine when the end effector 210 is in a certain orientation (e.g., preparing to pick an item, but when suction is turned off) the cooling only mode may be activated, as shown in FIG. 10. The controller 300 may activate the cooling only mode to improve cooling efficiency. For example, more cooling efficiency may be achieved when the end effector 210 is not actuating because more air can be pushed through the cooling sleeves by exiting the air via the exit valve 823 than directing the air through the end effector 210.

Figure 11:
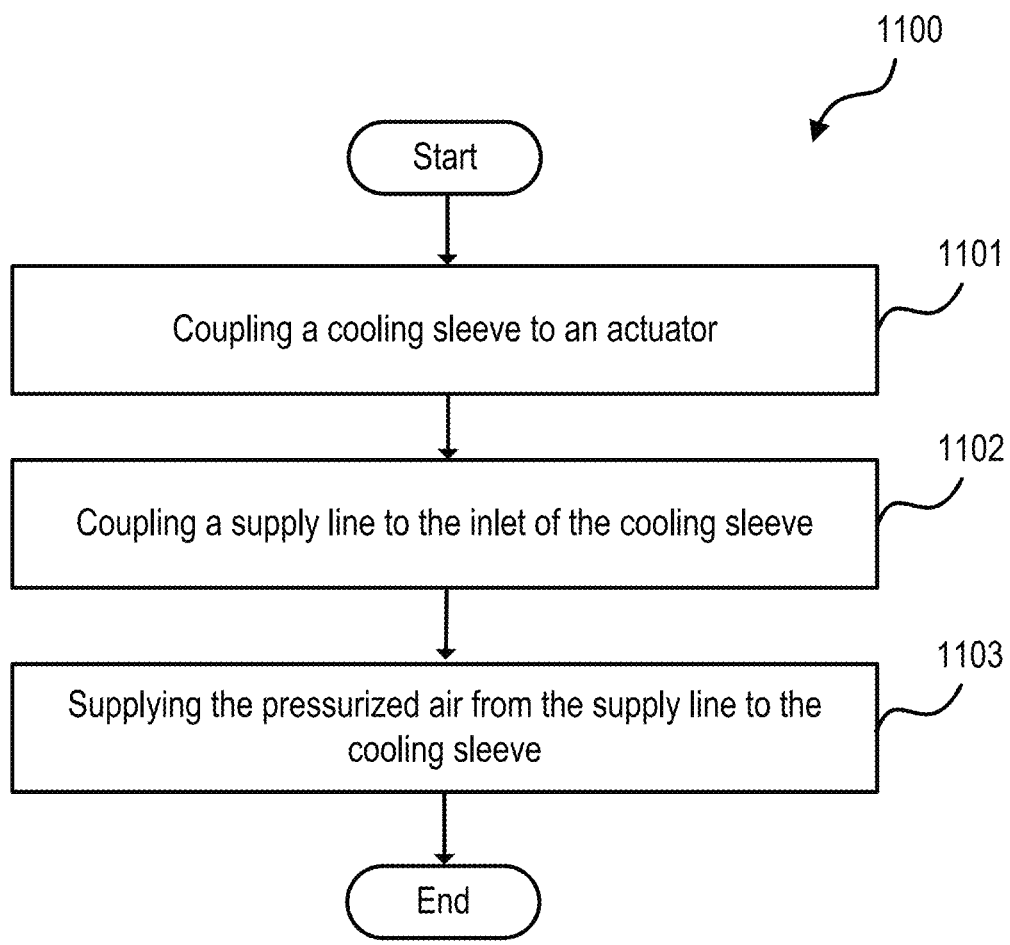
FIG. 11 is a method of cooling an actuator, according to at least one example.

FIG. 11 is a method 1100 of cooling an actuator of a robotic manipulator, according to at least one example. In some examples, cooling the actuators can involve employing the components of the cooling system 100 including one or more cooling sleeves. As an example, the method 1100 involves following operations.

At block 1101, the method 1100 involves coupling a cooling sleeve to an actuator of a robotic manipulator. The cooling sleeve may include an inlet and an outlet. The cooling sleeve used in the method 1100 may be the cooling sleeve 150, 400, 600, or any other suitable sleeve or other structure capable of cooling an actuator, as described herein. Thus, while the method 1100 is described with respect to the cooling sleeve 400 from introduced in FIG. 4 and FIG. 5, the method is not limited to the particular embodiment shown in these figures. As an example, as shown in FIG. 5, the cooling sleeve 400 can be coupled to the actuator 112. As discussed herein, the cooling sleeve 400 includes the inlet 401, the outlet 402, and the heat exchange surface 405. The cooling sleeve is coupled such that the heat exchange surface 405 is in contact with the external surface 112S of the actuator 112.

At block 1102, the method 1100 involves coupling a supply line to the inlet of the cooling sleeve, where the supply line is configured to deliver an air to a suction end effector of the robotic manipulator. For example, as shown in FIG. 8, the supply line 801 can be coupled to the inlet 401 of the cooling sleeve 400. In some examples, the supply line includes a flexible tube such as the flexible tube 801. The flexible tube 801 can deliver the air (e.g., from the air source 200) to the suction end effector after passing through the first cooling sleeves 400. The suction end effector includes the suction cup 214, as an example.

At block 1103, the method 1100 involves supplying the air from the supply line to the inlet of the cooling sleeve to cause cooling of the actuator. For example, as shown in FIG. 1, the air can be supplied from the air source 200 to the supply line 120 (or 801 in FIG. 8) to the inlet 401 of the cooling sleeve 400 to cool the actuator 112. In some examples, supplying the air to the inlet of the cooling sleeve involves opening a first flow control solenoid coupled between the supply line and the inlet of the cooling sleeve. In some examples, supplying the can also involve closing a second flow control solenoid coupled between the outlet of the cooling sleeve and the suction end effector. For example, as shown in FIG. 9A, the flexible tube 801 can supply the air from the air source 200 to the inlet of the cooling sleeve 400 to cause cooling of the actuator 112. The controller 300 (shown in FIG. 1) can send an open signal (e.g., S1=1 in FIG. 9A and FIG. 10) to the first flow control solenoid 821 to supply the air to the cooling sleeve 400. As the air circulates through the cooling sleeve 400, heat is extracted from the actuator 112 via the heat exchange surface 405 causing cooling of the actuator 112. Furthermore, the controller 300 may send a close signal (e.g., S2=0 in FIG. 10) to the second flow control solenoid 822 to exit the air through an exit port 823, as shown in FIG. 10. In another example, as shown in FIG. 9A, the controller 300 may open the second flow control solenoid 822 to enable simultaneous cooling of the actuators 112 and actuation of the suction end effector 210 by the same air.

Some or all of the process 1100 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

In some embodiments, the cooling system e.g., of FIG. 8 can be modified to include one or more bypass lines or bypass tubes. A bypass tube facilitates selective cooling of one or more actuators. For example, if an actuator does not need to be cooled, the air can be directed through the bypass tube to bypass one or more actuators and direct the air to a desired cooling sleeve.

Figure 12:
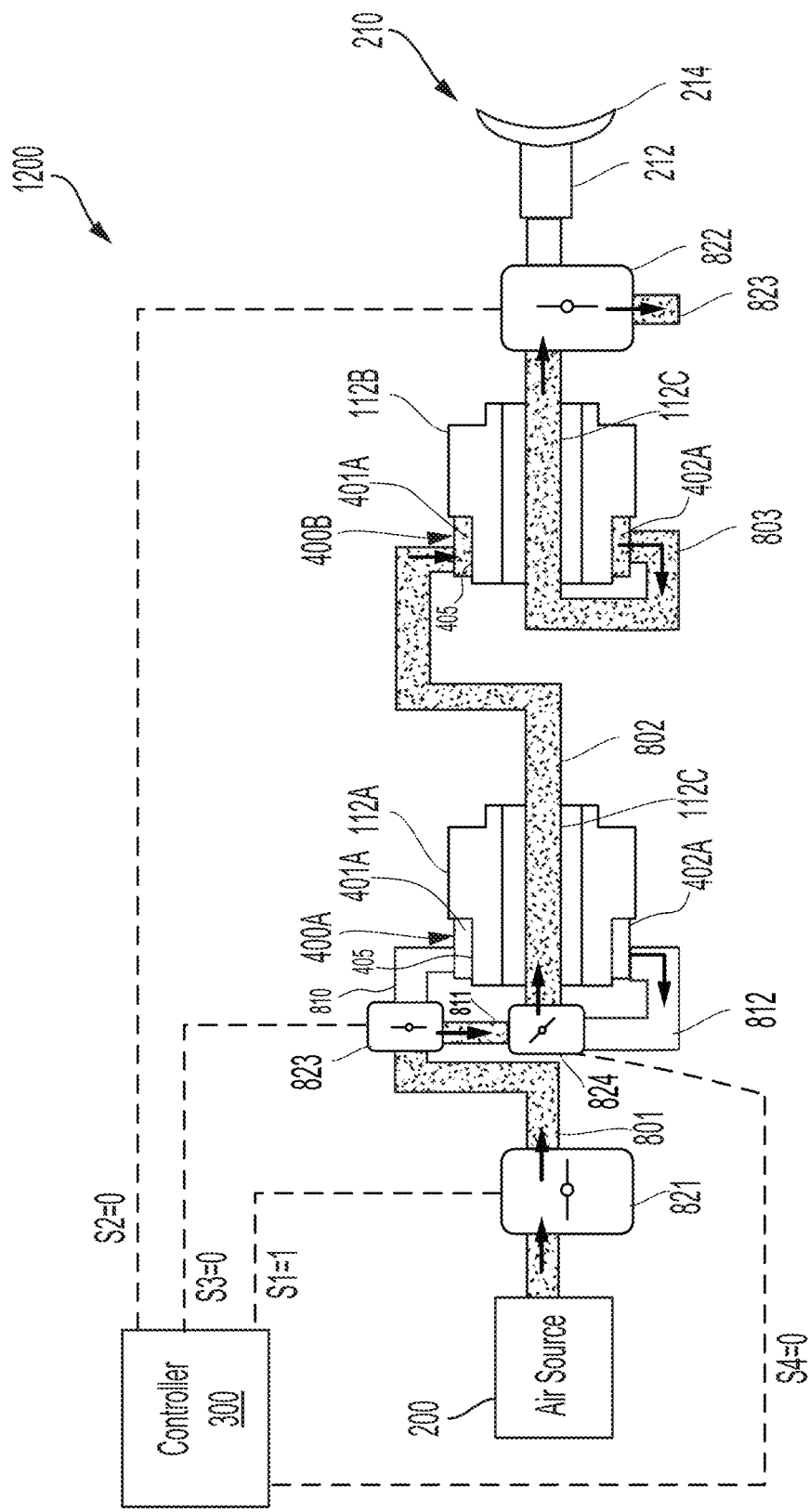
FIG. 12 is a schematic diagram of a cooling system with a bypass tube configured to bypass a first cooling sleeve, according to at least one example.
Figure 13:
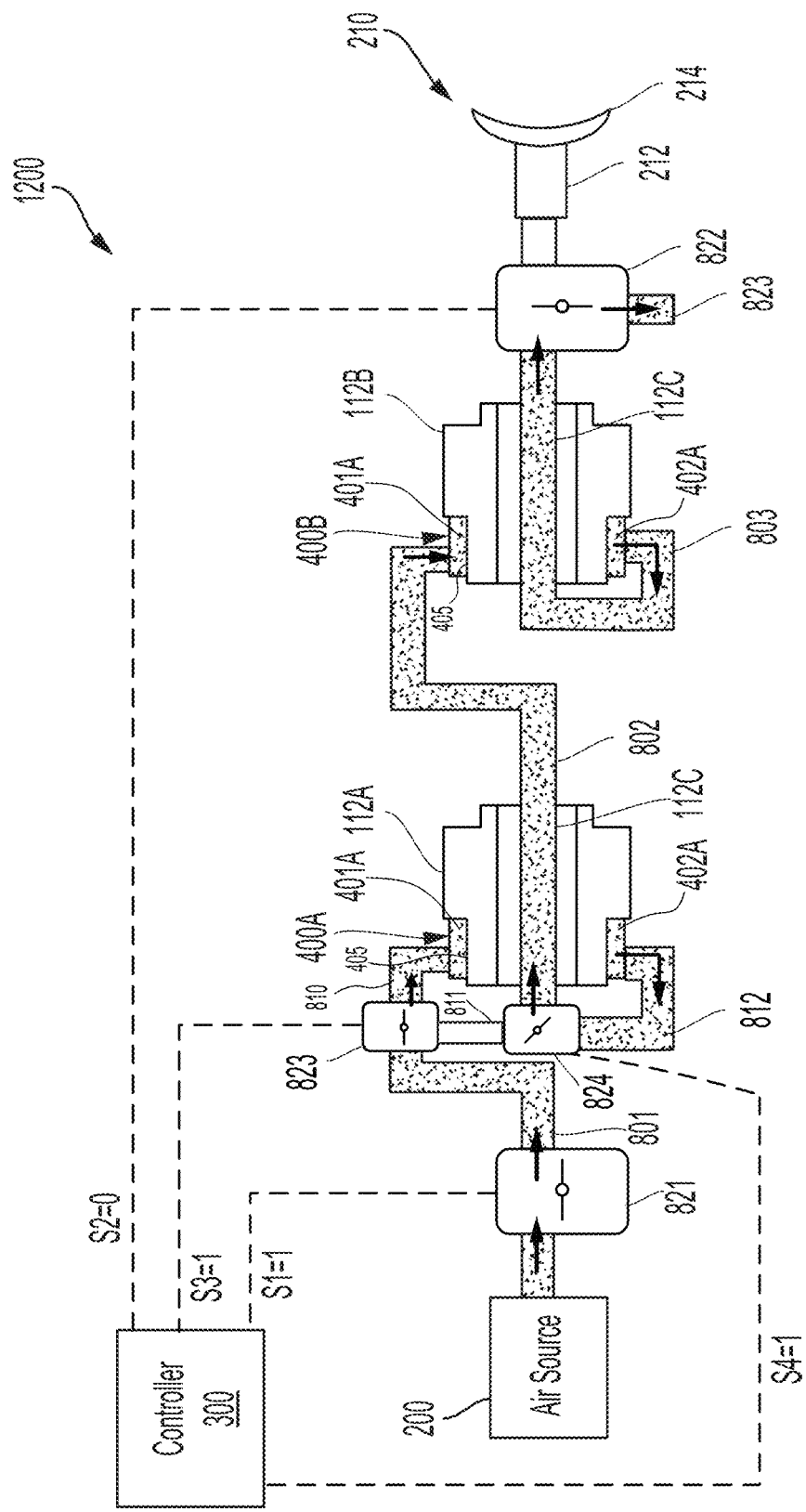
FIG. 13 is a schematic diagram of the cooling system with a bypass tube configured to pass air to both the first and second cooling sleeve, according to at least one example.

FIG. 12 is a schematic diagram of a cooling system 1200 with a bypass tube configured to bypass a first cooling sleeve, and FIG. 13 is a schematic diagram of the cooling system 1200 with the bypass tube configured to pass air to both the first and second cooling sleeve. The cooling system 1200 includes a bypass tube 811 configured to bypass the first cooling sleeve 400A. As shown, the bypass tube 811 can be coupled to the first flexible tube 801. Furthermore, to selectively bypass one or more actuators, flow control solenoids can be coupled to the bypass tube 811. For example, a third flow control solenoid 823 and a fourth flow control solenoid 824 can be coupled to the bypass tube 811 to activate or deactivate cooling of the first actuator 112A.

In the illustrated embodiments, the air flow through the bypass tube 811 can be controlled by the controller 300, which also controls the flow control solenoids 821 and 822. As shown, the controller 300 can send open (e.g., S3=1 or S4=1) or close signals (e.g., S3=0 or S4=0) to the flow control solenoids 823 and 824. The control signal can be based on temperature of the actuators, for example. Temperature sensors may be coupled to actuators to send temperature information to the controller 300. Based on the temperature information, the controller 300 can determine whether the temperature of the actuator breaches a temperature threshold. Responsive to breaching of the temperature threshold, the controller 300 can send open or close signals to the solenoids 823 and 824. For example, if the second actuator 112B is to be cooled, the controller 300 can send S3=0 and S4=0 to close the bypass tube 811 and bypass the first cooling sleeve 400A and direct the air to the second cooling sleeve 400B.

In another example shown in FIG. 12, the controller 300 may send close signals S3=0 to close the third solenoid 823 to direct the air from the air source 200 through the first flexible tube 801 to the bypass tube 811. Further, the controller 300 may send a signal S4=0 to close the fourth solenoid 824 to bypass the first cooling sleeve 400A and direct the air to the second cooling sleeve 400B. Thus, the first actuator 112A is bypassed and not cooled by the first cooling sleeve 400A.

In an example shown in FIG. 13, the controller 300 may send open signals S3=1 to open the third solenoid 823 to direct the air from the air source 200 through the first flexible tube 801 to a flexible tube 810 coupled to the first inlet 401A of the first cooling sleeve. Thus, the air passes through the first cooling sleeve 400A to cool the first actuator 112. Further, the controller 300 may send a signal S4=1 to open the fourth solenoid 824 to direct the air from the first outlet 402A of the first cooling sleeve 400A to the flexible tube 812 and direct the air to the second cooling sleeve 400B. Thus, both the first actuator 112A and the second actuator 112B can be cooled by respective cooling sleeves 400A and 400B.

It can be understood that flow air through the bypass tube 811 can be controlled by a separate controller, different from the controller 300. The separate controller may not communicate with the controller 300. The separate controller may send signals S3 and S4 to the flow control solenoids 823 and 824. The separate controller may receive temperature signals from the actuators to generate the signals S3 and S4.

The cooling system with one or more bypass tubes provides several advantages. For example, the cooling system can selectively cool a desired actuator. If the air goes through the bypass tube, the downstream actuators (e.g., the second actuator 112B) will receive cooler air than if the air goes through an upstream cooling sleeve (e.g., the first cooling sleeve 400A). The bypass tube can reduce pressure drop. As the air flows in a zig-zag pattern in the cooling sleeve, the outlet of the cooling sleeve is at a lower pressure compared to the inlet. With the bypass tube, it will reduce this pressure drop effect to minimum. As a result, a suction cup at the end-effector 210 will have more suction power. The bypass tube can also provide a fail-safe mechanism. If there is a leak in a cooling sleeve coupled to an actuator, the air can passed through the bypass tube to maintain a desired air pressure for downstream applications. With such fail-safe mechanism, an entire robot operation need not be turned off just to fix a cooling sleeve.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A robotic system, comprising:
   an actuator;
   an end effector operably coupled to the actuator;
   a supply line configured to supply air to the end effector, wherein the end effector is actuatable by the air; and
   a first cooling sleeve coupled external to the actuator, wherein the first cooling sleeve comprises (i) a first heat exchange surface in contact with the actuator, (ii) a first inlet, and (iii) a first outlet, wherein the first cooling sleeve is configured to receive the air from the supply line via the first inlet, to pass the air over the first heat exchange surface, and direct the air out of the first cooling sleeve via the first outlet.

2. The robotic system of claim 1, further comprising:
   a second actuator coupled to the actuator; and
   a second cooling sleeve coupled external to the second actuator, wherein the second cooling sleeve comprises (i) a second heat exchange surface in contact with the second actuator, (ii) a second inlet, and (iii) a second outlet, wherein the second cooling sleeve is configured to receive the air from the first outlet of the first cooling sleeve, to pass the air over the second heat exchange surface, and direct the air out of the second cooling sleeve via the second outlet.

3. The robotic system of claim 2, further comprising:
   a first flexible tube connecting the supply line to the first inlet of the first cooling sleeve; and
   a second flexible tube connecting the first outlet to the second inlet of the second cooling sleeve,
   wherein the first flexible tube passes through the actuator and the second flexible tube passes through the second actuator.

4. The robotic system of claim 3, further comprising:
   a first flow control solenoid coupled to the supply line before the first inlet of the first cooling sleeve, wherein the first flow control solenoid opens or closes flow of the air from the supply line to the first inlet; and
   a second flow control solenoid coupled to a second flexible tube between the second outlet of the second actuator and the end effector, wherein the second flow control solenoid opens or closes flow of the air from the second outlet to the end effector.

5. The robotic system of claim 4, further comprising:
   an exit port coupled to the second flow control solenoid, wherein the exit port to direct the air to atmosphere instead of to the end effector.

6. A cooling system, comprising:
   an actuator of a robotic manipulator operably coupled to an end effector, wherein the end effector is actuatable by air; and
   a cooling sleeve coupled to the actuator, wherein the cooling sleeve comprises (i) a heat exchange surface in contact with the actuator, (ii) an inlet, and (iii) an outlet, wherein the cooling sleeve is configured receive the air via the inlet, to pass the air over the heat exchange surface and direct the air out of the cooling sleeve.

7. The cooling system of claim 6, wherein the cooling sleeve comprises a pipe extending between the inlet and the outlet to convey the air from the inlet to the outlet, wherein the pipe comprises a plurality of sections wound in a circular shape such that an inner diameter of the circular shape contacts an external surface of the actuator or the heat exchange surface.

8. The cooling system of claim 6, wherein the cooling sleeve comprises a tube that defines an interior volume extending between the inlet and the outlet, and wherein a corrugated strip is disposed within the interior volume, wherein the corrugated strip comprises channels to convey the air from the inlet to the outlet configured.

9. The cooling system of claim 8, wherein the corrugated strip is wound in a circular shape with channels transversely extending over the heat exchange surface such that the channels allow the air to pass over the heat exchange surface to extract heat from the actuator.

10. The cooling system of claim 6, further comprising:
a second actuator connected in series with the actuator, wherein the second actuator is coupled with a second cooling sleeve.

11. The cooling system of claim 10, further comprising a flexible tube, wherein the second cooling sleeve is connected to the cooling sleeve via the flexible tube, wherein the actuator comprises an internal passage through which the flexible tube can be passed and further connected to the second cooling sleeve connected in the series.

12. The cooling system of claim 6, further comprising:
a first flow control solenoid configured to open or close supply of the air to the inlet of the cooling sleeve; and
a second flow control solenoid configured to open or close supply of the air from the outlet of the cooling sleeve to the end effector.

13. The cooling system of claim 12, wherein each of the first flow control solenoid and the second flow control solenoid is independently operable between an open state and a closed state.

14. The cooling system of claim 13, wherein when both the first flow control solenoid and the second flow control solenoid are in the open state, the air cools the actuator and actuates the end effector; or
when the first flow control solenoid is in the open state and the second flow control solenoid is in the closed state, the air cools the actuator and does not actuate the end effector.

15. The cooling system of claim 6, wherein the cooling sleeve is integrally formed on a surface of the actuator.

16. The cooling system of claim 6, wherein the heat exchange surface is made of a heat conductive material.

17. The cooling system of claim 6, wherein the cooling sleeve comprises a tube that passes through an internal channel of the actuator.

18. The cooling system of claim 6, wherein the air passed through the cooling sleeve is pressurized air flowing from an air source to the end effector or vacuum air flowing from the end effector toward the air source.

19. A method of cooling an actuator of a robotic manipulator, the method comprising:
coupling a cooling sleeve to the actuator of the robotic manipulator, the cooling sleeve comprising an inlet and an outlet;
coupling a supply line to the inlet of the cooling sleeve, the supply line being configured to deliver air to a suction end effector of the robotic manipulator; and
supplying the air from the supply line to the inlet of the cooling sleeve to cause cooling of the actuator.

20. The method of claim 19, wherein supplying the air to the inlet of the cooling sleeve comprises:
opening a first flow control solenoid coupled between the supply line and the inlet of the cooling sleeve; and
closing a second flow control solenoid coupled between the outlet of the cooling sleeve and the suction end effector.

* * * * *